United States Patent [19]

Yamada et al.

[11] Patent Number: 4,954,824

[45] Date of Patent: Sep. 4, 1990

[54] SAMPLE RATE CONVERSION SYSTEM HAVING INTERPOLATION FUNCTION WITH PHASE LOCKED CLOCK

[75] Inventors: Masahiro Yamada, Kawasaki; Kiyoyuki Kawai, Yokosuka, both of Japan

[73] Assignee: Kabushiki Kaisha Toshiba, Kawasaki, Japan

[21] Appl. No.: 244,295

[22] Filed: Sep. 15, 1988

[30] Foreign Application Priority Data

Sep. 18, 1987 [JP] Japan .................................. 62-233947

[51] Int. Cl.$^5$ ............................................ H03M 7/00
[52] U.S. Cl. ...................................... 341/61; 341/122; 364/724.1
[58] Field of Search ........................ 341/61, 122, 123; 364/723, 724.01; 375/122

[56] References Cited

U.S. PATENT DOCUMENTS

| | | | |
|---|---|---|---|
| 4,091,335 | 5/1978 | Giolma et al. | 331/34 |
| 4,460,890 | 7/1984 | Busby | 341/61 |
| 4,513,427 | 4/1985 | Borriello et al. | 375/110 |
| 4,612,573 | 9/1986 | Grallert et al. | 341/61 |
| 4,797,845 | 1/1989 | Stikvoort | 341/123 |

FOREIGN PATENT DOCUMENTS

57-159121 10/1982 Japan .
63-86932  4/1988 Japan .
63-177619 7/1988 Japan .

*Primary Examiner*—William M. Shoop, Jr.
*Assistant Examiner*—H. L. Williams
*Attorney, Agent, or Firm*—Cushman, Darby & Cushman

[57] ABSTRACT

A sample rate conversion circuit converts first digital data processed by a first clock signal having a first frequency into digital data processed by a second clock signal having a second frequency. A ring oscillator has a predetermined number of voltage-controlled gate delay elements connected to each other in the form of a loop so as to output polyphase delay clock signals and a predetermined self-excited oscillation signal. A phase-locking circuit applies a control voltage corresponding to a phase difference between the first clock signal and the self-excited oscillation signal to each of the voltage-controlled gate delay elements so as to phase-lock the first clock signal with the self-excited oscillation signal output from the ring oscillator. A latch circuit latches the polyphase delay clock signals output from the ring oscillator in accordance with the second clock signal. An interpolation coefficient generator generates an interpolation coefficient corresponding to phase data between the first and second clock signals in accordance with the polyphase delay clock signals latched by the latch circuit. An interpolating circuit interpolates two adjacent data of the first digital data by using the interpolation coefficient generated by the interpolation coefficient generator and outputting the interpolated data as the second digital data.

17 Claims, 11 Drawing Sheets

F I G. 2

| PHASE OF CK2 | INPUT OF LATCH CIRCUIT 124 | | | | INTERPOLATION COEFFICIENT | |
|---|---|---|---|---|---|---|
| | 41 | 42 | 43 | 44 | k | 1 − k |
| 46 | 1 | 0 | 0 | 0 | 0 | 1 |
| 47 | 1 | 1 | 0 | 0 | 0.125 | 0.875 |
| 48 | 1 | 1 | 1 | 0 | 0.25 | 0.75 |
| 49 | 1 | 1 | 1 | 1 | 0.375 | 0.625 |
| 50 | 0 | 1 | 1 | 1 | 0.5 | 0.5 |
| 51 | 0 | 0 | 1 | 1 | 0.625 | 0.375 |
| 52 | 0 | 0 | 0 | 1 | 0.75 | 0.25 |
| 53 | 0 | 0 | 0 | 0 | 0.875 | 0.125 |

SAMPLE RATE CONVERSION SYSTEM HAVING INTERPOLATION FUNCTION WITH PHASE LOCKED CLOCK

BACKGROUND OF THE INVENTION

1. Field of the Invention

This invention relates to a sample rate conversion system having an interpolation function and, more particularly, to a sample rate conversion system which can be suitably applied to a sample rate converter (SRC) for converting sample rates of digital data between circuits respectively operated by clocks having a first frequency and a second frequency which is different from the first frequency.

2. Description of the Related Art

In order to allow two digital data processing systems having different operating frequencies to exchange digital data, sample rates of digital data must be converted.

U.S. Pat. Application Ser. No. 102,569 assigned by the same assignee of present application discloses an SRC using cascade-connected multistage delay gates for obtaining a phase relationship between two clock signals, which is necessary for linear interpolation of data.

According to the SRC in the first embodiment of the prior application, however, in phase data detection between clocks, if the delay time of the delay gates varies, correct interpolation coefficients cannot be obtained.

Furthermore, in the SRC according to the second embodiment of the prior application, interpolation coefficients are corrected in accordance with a variation in delay time of the delay gates. However, the circuit arrangement of the SRC according to the second embodiment of the prior art becomes complex because of correction of interpolation coefficients.

SUMMARY OF THE INVENTION

It is, therefore, an object of the present invention to provide a new and improved sample rate conversion system having an interpolation function, which can correct a variation in delay time of delay gates and obtain correct phase data for interpolation coefficients between clocks having different frequencies by using a simple circuit arrangement.

According to one aspect of the present invention, there is provided a sample rate conversion circuit for converting first digital data processed by a first clock signal having a first frequency into digital data processed by a second clock signal having a second frequency, comprising:

ring oscillator means, having a predetermined number of voltage-controlled gate delay elements connected to each other in the form of a loop, for outputting polyphase delay clock signals and a predetermined self-excited oscillation signal;

phase-locking means for applying a control voltage corresponding to a phase difference between the first clock signal and the self-excited oscillation signal to each of the voltage-controlled gate delay elements so as to phase-lock the first clock signal with the self-excited oscillation signal output from the ring oscillator means;

latch means for latching the polyphase delay clock signals output from the ring oscillator means in accordance with the second clock signal;

interpolation coefficient generating means for generating an interpolation coefficient corresponding to phase data between the first and second clock signals in accordance with the polyphase delay clock signals latched by the latch means; and interpolating means for interpolating two adjacent data of the first digital data by using the interpolation coefficient generated by the interpolation coefficient generating means and outputting the interpolated data as the second digital data.

BRIEF DESCRIPTION OF THE DRAWINGS

Other objects and features of the present invention can be understood through the following embodiments by reference to the accompanying drawings, in which.

DETAILED DESCRIPTION OF THE PREFERRED EMBODIMENTS

Prior to a description of embodiments of the present invention, the prior application will be described below.

Figure 7:
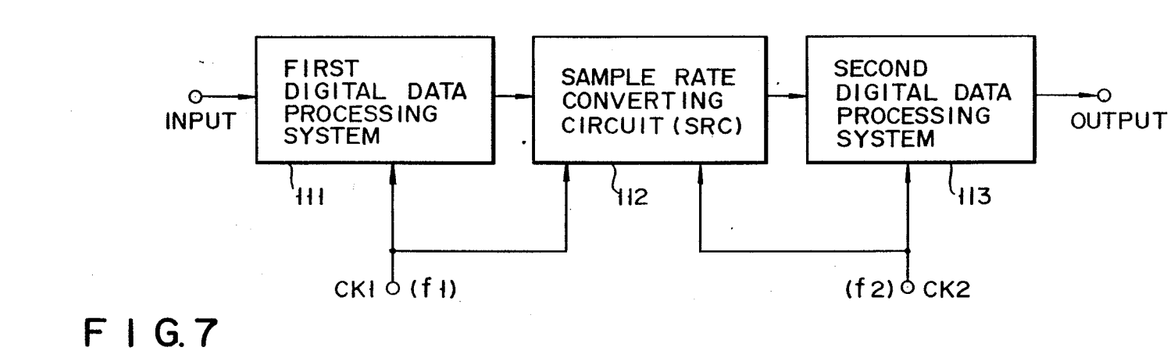
FIG. 7 is a block diagram showing a schematic arrangement of a sample rate converter according to a prior application.

Referring to FIG. 7, reference numeral 111 denotes a first digital data processing system for sampling input data in accordance with clock CK1 having frequency f1; 113, a second digital data processing system for sampling input data in accordance with clock CK2 having frequency f2 which is different from frequency f1; and 112, an SRC for converting a sample rate of data output from first system 111 into a rate suitable for data processing in second system 113.

Figure 8:
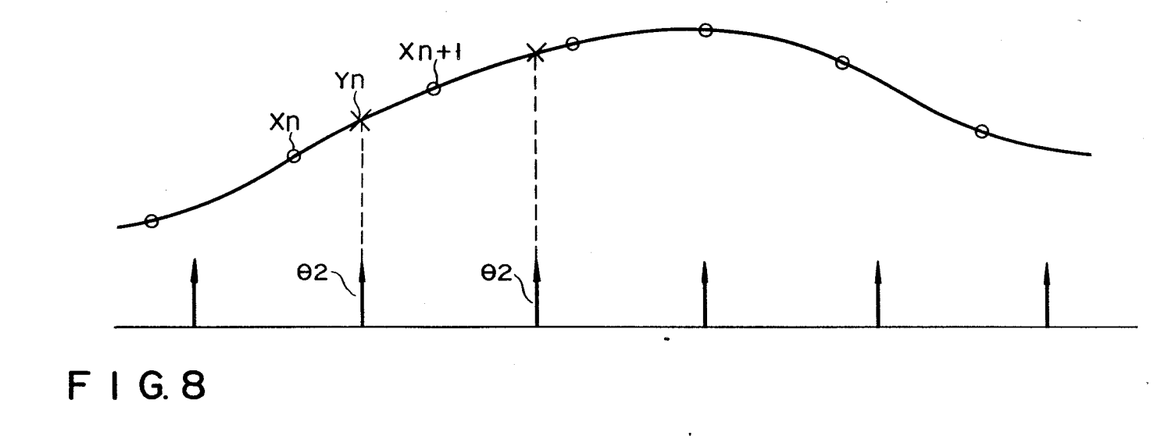
FIG. 8 is a view for explaining a principle of sample rate conversion by means of the circuit in FIG. 7.

An operation principle of SRC 112 will be described below with reference to FIG. 8. Referring to FIG. 8, reference symbols $X_n$ and $X_{n+1}$ denote data output from first digital data processing system 111 in synchronism with clocks CK1. In order to transfer these data to second digital data processing system 113 operated by clock CK2, data $Y_n$ is obtained at the timing of phase $\theta 2$ of clock CK2 and is supplied to second system 113. For this purpose, linear interpolation of data $X_n$ and data $X_{n+1}$ may be performed. Interpolation coefficients for this interpolation can be obtained by obtaining a phase relationship between clock signals CK1 and CK2.

Figure 9:
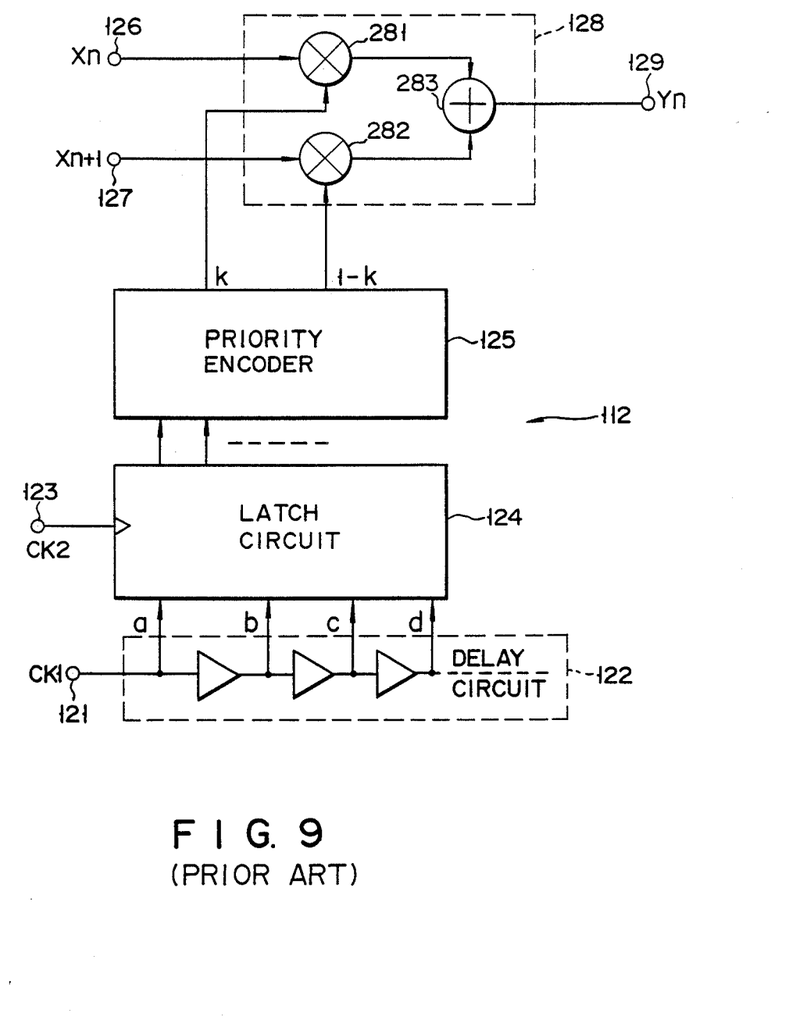
FIG. 9 is a circuit diagram showing a detailed arrangement of the sample rate converter according to the prior application.
Figure 10:
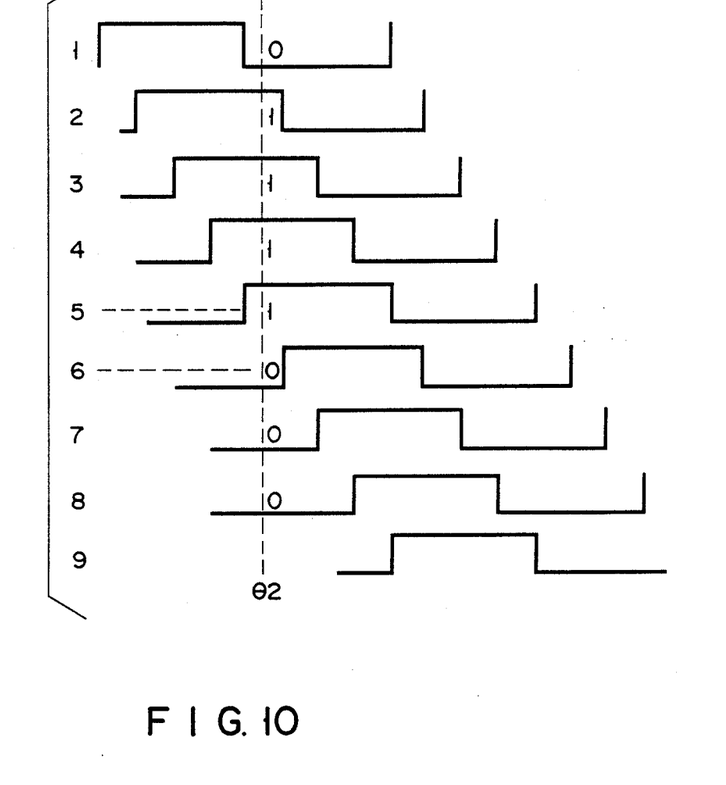
FIG. 10 is a timing chart for explaining the principle of sample rate conversion.

FIG. 9 is a circuit diagram showing a detailed arrangement of SRC 112 according to a first embodiment of the prior application. Clock CK1 to be supplied to terminal 121 is delayed by delay circuit 122 obtained by cascade-connecting, e.g., eight gates. With this operation, as shown in FIG. 10, nine phase delay clocks including clock CK1 can be obtained. These nine phase delay clocks are latched by latch circuit 124 in response to clock CK2.

Assuming that phase $\theta2$ of clock CK2 is set as shown in FIG. 10, latch data of latch circuit 124 can be represented by "01111000". Priority encoder 125 obtains the above interpolation coefficients by detecting bits where pattern "10" is present.

In FIG. 10, "1" of pattern "10" is present in the fifth bit of the output bits of latch circuit 124, and "0" is present in the sixth bit thereof. With this detection, interpolation coefficients $\frac{5}{8}(=k)$ and $\frac{3}{8}(=1-k)$ can be obtained. That is, the interpolation coefficients are obtained as ratios of a time interval between data $X_n$ and clock CK2 to that between data $X_{n+1}$ and clock CK2.

Interpolation coefficient k is supplied to multiplier 281 of variable filter 128, and is multiplied by data $X_n$ supplied from terminal 126. Interpolation coefficient $(1-k)$ is supplied to multiplier 282, and is multiplied by data $X_{n+1}$ supplied from terminal 127. The two multiplication results are added by adder 283, and the resultant value is output to terminal 129 as data $Y_n$.

In the above arrangement, a relationship between the delay time of the gates and the frequency of clock CK1 must be established in such a manner that clock CK1 supplied from terminal 121 is delayed by one period after clock CK1 passes through the eight gates, as shown in FIG. 10. However, since the delay time of the gates is not stable, interpolation coefficients may not be correctly calculated in the above arrangement. Especially, in FIG. 8, when phase $\theta2$ is present near data $X_n$, errors of interpolation coefficients k and $(1-k)$ become large. As described above, the bits of pattern "10" are shifted to upper bits as the delay amount of the gates is decreased. When phase $\theta2$ approaches data $X_{n+1}$, the pattern is deviated from the eighth bit, and hence interpolation coefficients cannot be obtained.

Figure 11A:
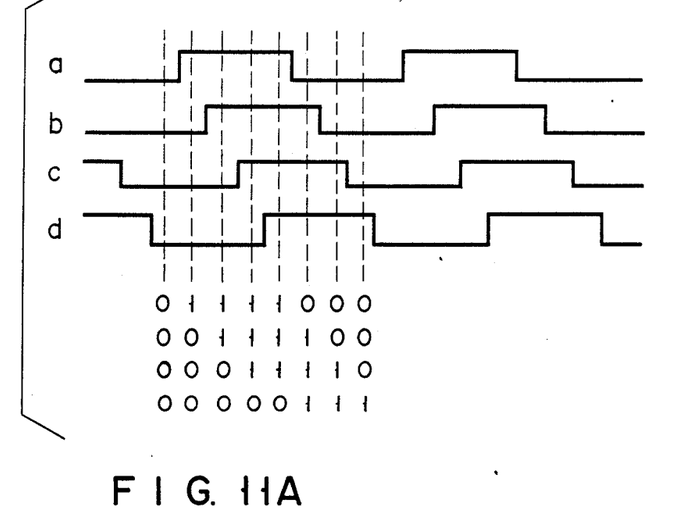
FIGS. 11A and 11B are timing charts for explaining problems of the circuit in FIG. 9.

The reasons why such problems are posed in the SRC according to the first embodiment of the prior art will be described with reference to Figs. 11A and 11B.

Assume that input/output signals of the first three delay gates are set to a, b, c, and d, as shown in FIG. 9. If, in this case, a gate delay amount is $\frac{1}{4}$ clock CK1, four-bit patterns are generated at the respective phases of clock CK2, which are indicated by dotted lines in FIG. 11A.

Figure 11B:
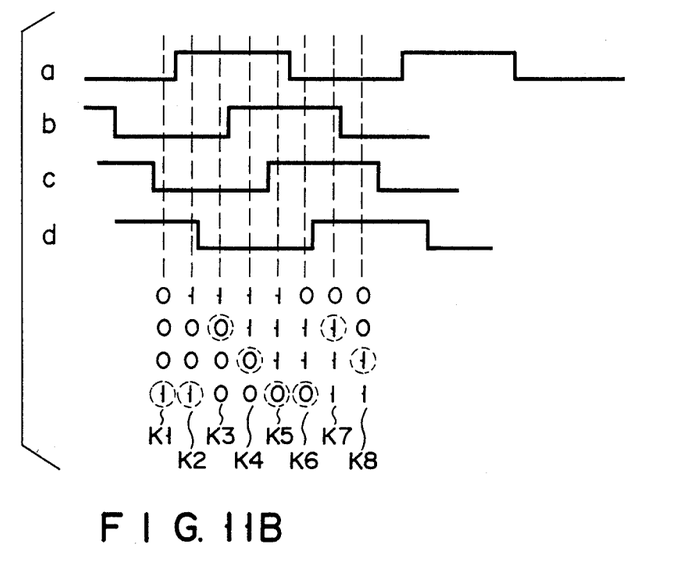

If the gate delay amount is increased, bit patterns shown in FIG. 11B are obtained. More specifically, the outputs from latch circuit 124 at the respective phases of clock CK2, which are indicated by dotted lines in FIG. 11B constitute patterns having different bits (encircled by dotted line in FIG. 11B) from those of the normal bit patterns. This causes erroneous phase data detection. Referring to FIG. 11B, bit patterns corresponding to those at the phase points in FIG. 11A each shifted by one phase point are output at phase points K1, K3, K4, K5, K7, and K8 of phase points K1 to K8. In addition, bit patterns which cannot be obtained in FIG. 11A are output at phase points K2 and K6. As a result, deviated interpolation coefficients or no interpolation coefficient may be obtained, thereby posing a problem.

Figure 12:
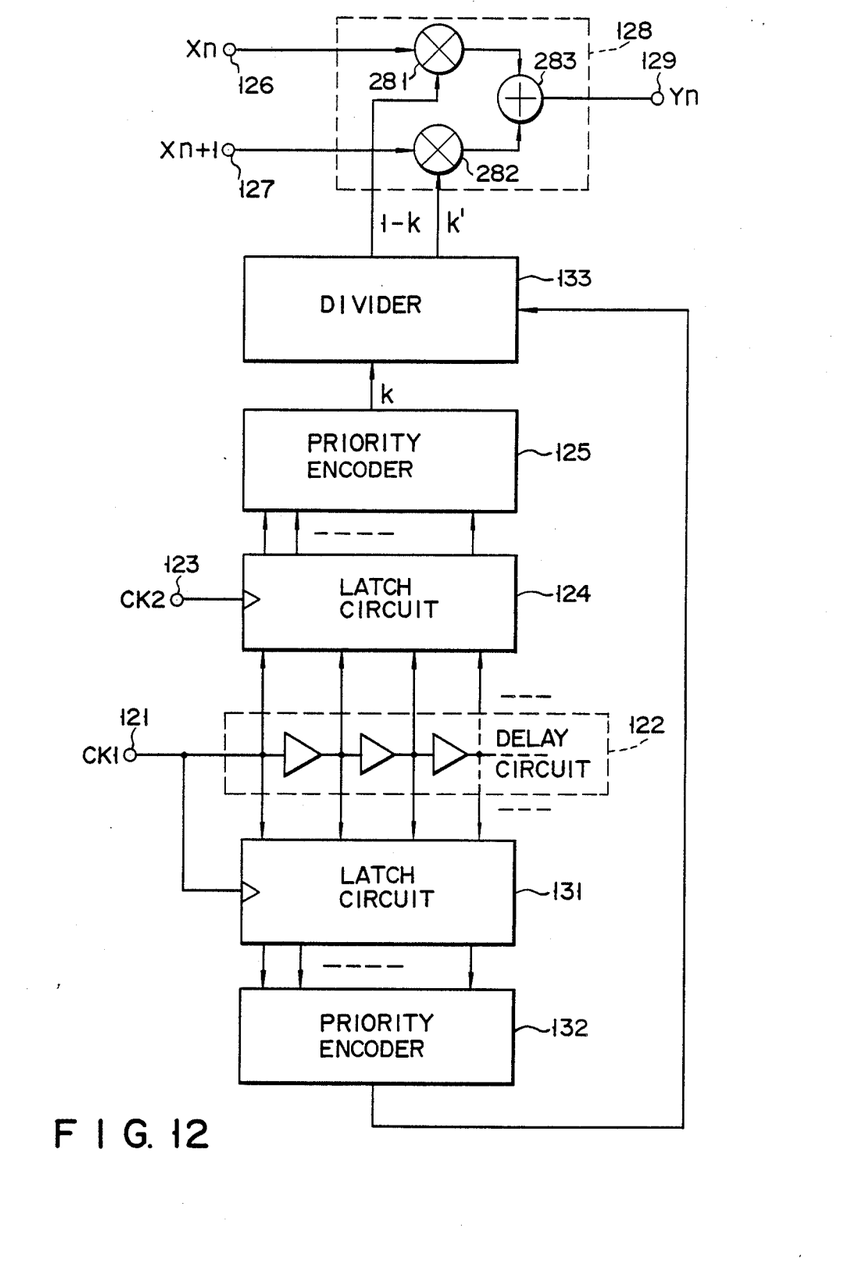
FIG. 12 is a circuit diagram showing a detailed arrangement of another SRC according to the prior art.

FIG. 12 shows an SRC according to a second embodiment of the prior application. Similar to the SRC shown in FIG. 9, in this SRC, a polyphase delay output of a clock signal prior to conversion is latched by using a clock signal upon conversion, and an interpolation relationship is obtained from this latch output. In addition to this arrangement, the polyphase delay output is latched by the clock signal prior to conversion, and a phase relationship between the clock signal prior to conversion and the polyphase delay output is detected from this latch output, thereby correcting the interpolation coefficients on the basis of this detection result.

According to the above arrangement, even if the delay time of the delay gates varies, interpolation coefficients are corrected in accordance with its variation amount. Therefore, correct interpolation coefficients can always be obtained.

Note that the same reference numerals in FIG. 12 denote the same parts as in FIG. 9.

Referring to FIG. 12, a polyphase delay clock signal output from delay circuit 122 is latched by one latch circuit 131 in response to clock signal CK1. This latch output is supplied to one priority encoder 132. Priority encoder 132 detects a relative phase between clock signal CK1 and the polyphase delay clock signal by detecting bits where pattern "10" is present in input data.

A detection output from encoder 132 is supplied to subtracter 133. In addition, interpolation coefficient k obtained by encoder 125 is supplied to subtracter 133. Subtracter 133 subtracts interpolation coefficient k in accordance with the detection result of encoder 131. Assuming that this subtraction result is k', subtracter 133 further obtains coefficient $(1-k')$, and provides coefficients k' and $(1-k')$ to multipliers 281 and 282 as normal interpolation coefficients, respectively.

In the above arrangement, if the delay time of the gates of delay circuit 122 varies, a relative phase relationship between clock signal CK1 and the polyphase delay clock signal varies. Therefore, latch circuit 131, which latches the polyphase delay clock signal in response to clock signal CK1, can latch the variation amount of the delay amount. The latched variation amount is detected by encoder 132 as the variation amount of the above relative phase. If interpolation coefficient k is subtracted by using this detection result, interpolation coefficient k can be normalized, thereby obtaining interpolation coefficient k' which is free from the influences of the variation in delay amount.

The polyphase delay clock signal being latched by latch circuit 131 in response to clock signal CK1 prior to conversion, is equivalent to the polyphase clock signal being latched by the other latch circuit 125 at the output timing of data Xn+1 shown in FIG. 8. Furthermore, in such a case, interpolation coefficient k is set to be one. Therefore, the polyphase delay clock signal being latched using clock signal CK1 means that the bits where pattern "10" appears can be detected when interpolation coefficient k is one.

In latch circuit 131, these bits vary in accordance with a variation in delay time of the delay gates. In contrast to this, in latch circuit 124, they are fixed regardless of a variation in delay time. Therefore, if the output from encoder 125 is subtracted by using the output from encoder 132, the variation in interpolation coefficient k associated with the variation in delay time can be corrected.

Note that in FIG. 12, the delay times of the respective gates constituting delay circuit 122 are set to be equal to those of the circuit in FIG. 9. In FIG. 9, the number of delay stages is set to be eight, however, in FIG. 12, it is set to be nine. This arrangement allows the total delay amount of delay circuit 122 to be longer than one period of clock signal CK1 even if a delay time value becomes smaller than a normal value. This arrangement prevents pattern "10" from appearing outside the most significant bit, and hence prevents the occurrence of a case wherein interpolation coefficient k' cannot be obtained.

Figure 13:
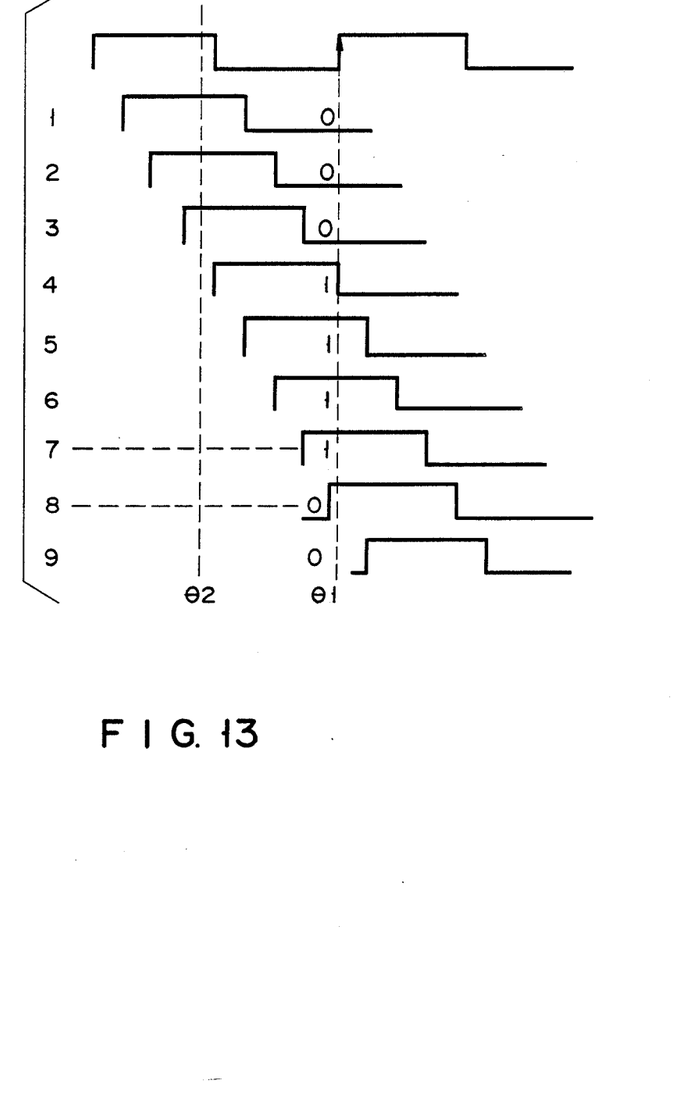
FIG. 13 is a timing chart for explaining an operation of the circuit in FIG. 12.

FIG. 13 shows the latch timings of latch circuits 124 and 131 with respect to nine phase delay clock signals output from delay circuit 122.

Since latch circuit 131 latches polyphase clock signals at a timing immediately before phase $\theta 1$ of the edge of clock signal CK1, the latch output from latch circuit 131 becomes "000111100".

Pattern "10" appears in the seventh and eighth bits. In this case, the delay time in one clock period becomes longer than the delay time of the seven gates, and shorter than the delay time of the eight gates. When the nine phase delay clocks are latched in response to clocks CK2, the positions where pattern "10" appears in the latch output are in the range of the first to eighth bits, and the pattern is output from the seventh bit.

Subtracter 133 outputs $1-\frac{1}{8}$ to $1-8/8$ as interpolation coefficient k' with respect to the values of the first to eighth bits, and outputs $\frac{1}{8}$ to $8/8$ as interpolation coefficient $(1-k')$.

With this operation, the SRC according to the second embodiment of the prior art can always obtain correct interpolation coefficients even if the delay time of the delay gates varies. Compared with the SRC in FIG. 9, however, the circuit arrangement of this SRC is complicated especially in that subtracter 133 is required. With this arrangement, the circuit size is increased, and hence the cost is increased, thereby posing various problems in practical use.

The present invention will be summarized. In order to solve the problems of the above-described prior application, in the present invention, in place of the circuit for delaying an input clock using multi-stage delay gate elements and forming polyphase delay clocks in the prior art, a ring oscillator whose oscillation frequency is synchronized with an input clock is used. Since the ring oscillator is constituted by multistage-connected gate delay elements, inputs and outputs of these gate delay elements are output as polyphase delay clocks, and the polyphase delay clocks are simultaneously latched by a latch circuit by using a clock having another frequency, thereby obtaining phase relationship data.

With the above arrangement, the ring oscillator oscillates in synchronism with an input clock, divides the input clock period by the number of gate delay elements, and obtains polyphase delay clocks which are present in the respective divided phase positions. Therefore, the polyphase clocks can be synchronized with the input clock without being influenced by variations in the gate delay elements. As a result, in latch circuit section, the phase relationship data with respect to the second clock can be obtained as correct data without requiring correction by the subtracter.

Embodiments of the present invention will be described with reference to the accompanying drawings.

Figures 1A, 1B:
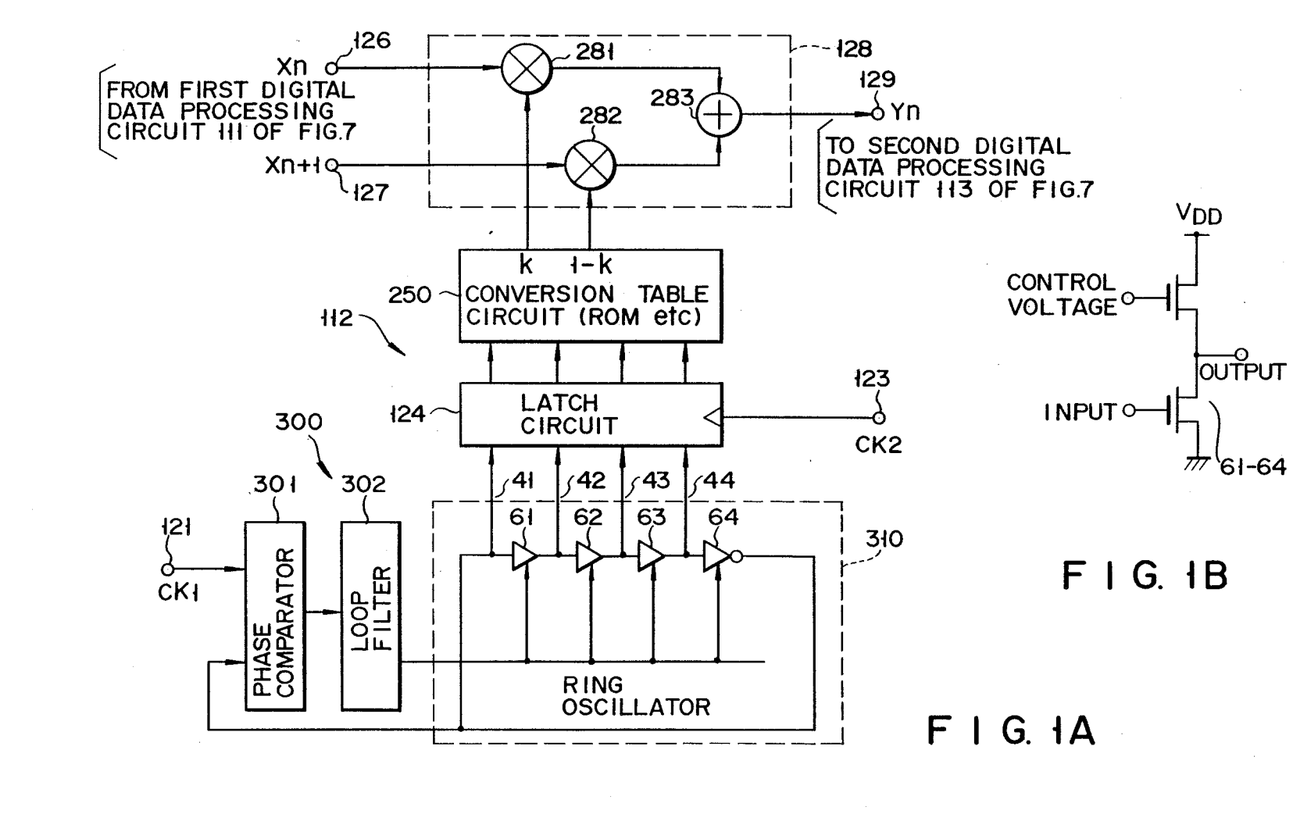
FIG. 1A is a circuit diagram showing an embodiment of the present invention.
FIG. 1B is a view showing a detailed arrangement of a gate delay element used in the circuit of FIG. 1A.

FIG. 1A shows an embodiment of the present invention. Clock CK1 having first frequency f1 as an input clock is input to one terminal of phase comparator 301 (constituting phase-locking circuit 300) through input terminal 121. An oscillation output ring oscillator 310 is supplied to the other terminal of phase comparator 301. Ring oscillator 310 is designed such that a plurality of (n) stages of gate delay elements (in FIG. 1A, four stages of gate delay elements 61, 62, 63, and 64) capable of correcting and controlling a delay amount, each of which is constituted by, e.g., a MOSFET IC in FIG. 1B disclosed in Japanese Patent Disclosure (Kokai) No.57-159121, are series-connected in the form of a loop. DC control signals corresponding to phase errors from loop filter 302 connected to the output terminal of phase comparator 301 are supplied to delay amount control terminals of voltage-controlled gate delay elements 61, 62, 63, and 64. With this operation, the oscillation output from ring oscillator 310 is synchronized with input clock CK1.

Figure 2:
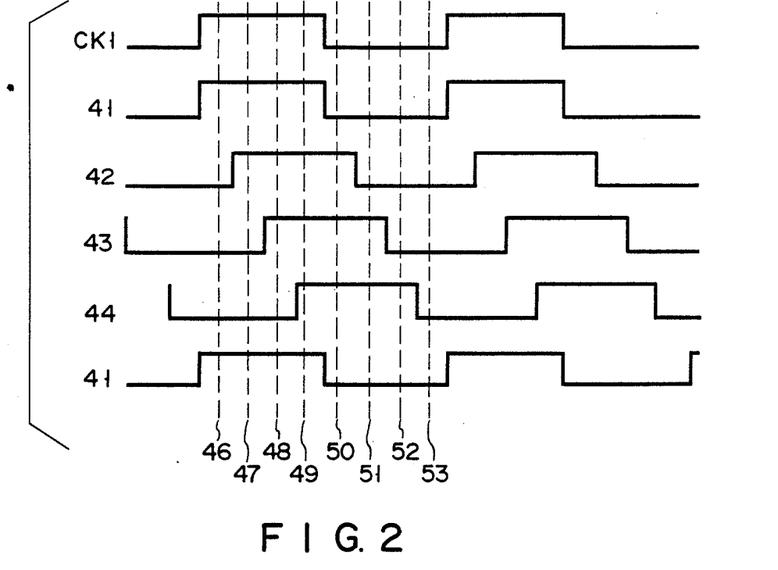
FIG. 2 is a timing chart showing ring oscillator outputs in FIG. 1.

Polyphase delay clocks 41, 42, 43, and 44 obtained from the respective delay elements of ring oscillator 310 exhibit characteristics shown in FIG. 2 with respect to input clock CK1.

Assume that the delay amount per gate delay element is $\Delta t$. If an input to gate delay element 61 is set at high level "H", an output after going through the four gate delay elements, i.e., an output from gate delay element 64 is set at low level "L" after a lapse of time $4 \times \Delta t$, and is input to gate delay element 61. During subsequent time $4 \times \Delta t$, an output from gate delay element 64 is set at high level "H". The above operation is repeated. Self-excited oscillation signal frequency f can be represented by:

$$f=(\tfrac{1}{2}) \cdot \tfrac{1}{4} \cdot \Delta t \qquad \ldots (1)$$

Since, in this case, $\Delta t$ is controlled by an output from loop filter 302 connected to the output terminal of phase comparator 301, f can be changed. Therefore, output 41 from oscillator 310 is phase-locked with the input clock. In this case, from equation (1), $$t=(\tfrac{1}{4}) \cdot 1/f$$

Accordingly, each of delay clocks 41, 42, 43, and 44 is output as phase data obtained by dividing one period of input clock CK1 by eight.

Figure 3:
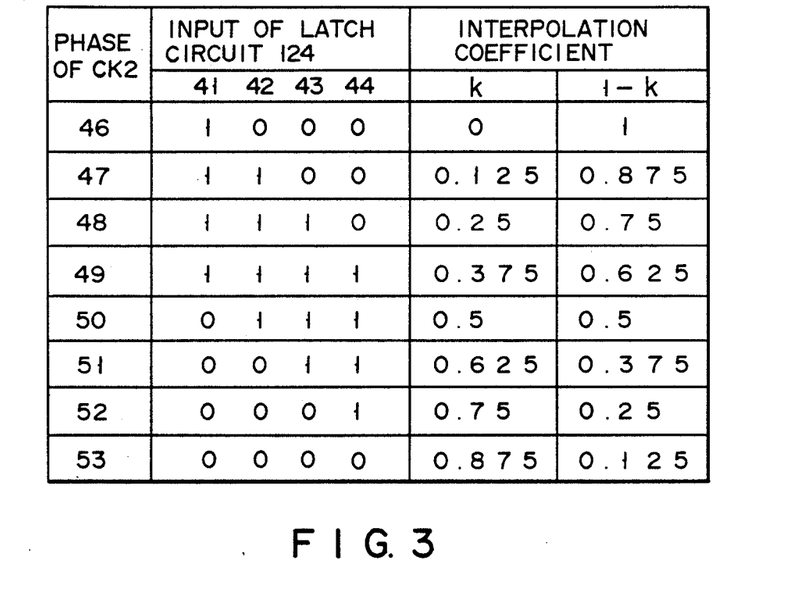
FIG. 3 is a view illustrating a relationship between a latch circuit and a conversion table circuit in FIG. 1.

If eight phases 46 to 53 are represented by the delay clock as shown in FIG. 2, output data from latch circuit 124 becomes identical to data at one of phases 46 to 53 shown in FIG. 3. That is, delay clocks 41 to 44 are latched by latch circuit 124 in accordance with clock CK2 having second frequency f2 different from first frequency f1 of clock CK1.

The output from latch circuit 124 is supplied to conversion table circuit 250 constituted by a ROM or a random logic circuit. Conversion table circuit 250 generates, e.g., coefficients k and $(1-k)$ in accordance with the output contents of latch circuit 124.

Interpolation processing after this operation is performed in the same manner as described in FIG. 9. However, as described above, the SRC using the ring oscillator can eliminate the problems posed in the SRC of FIG. 9. In addition, unlike the SRC in FIG. 12, the circuit arrangement of the SRC in this embodiment is not complicated.

The present invention is not limited to the above embodiment. In the above embodiment, phase locking between the ring oscillator and an input clock is mainly described. However, if this phase locking is not stable, data supplied to the variable filter 128 side is phase-locked with an output from the ring oscillator so as to realize further reliable data processing.

Figure 4:
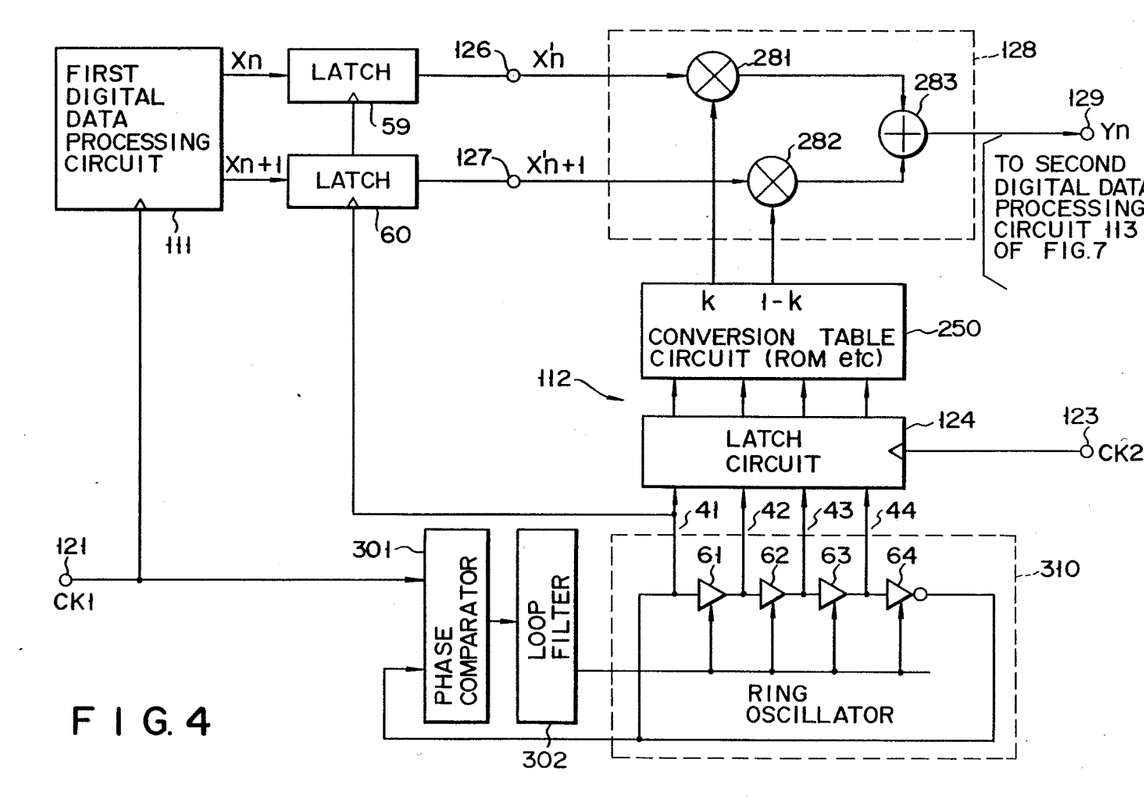
FIG. 4 is a circuit diagram showing another embodiment of the present invention.
Figure 6:
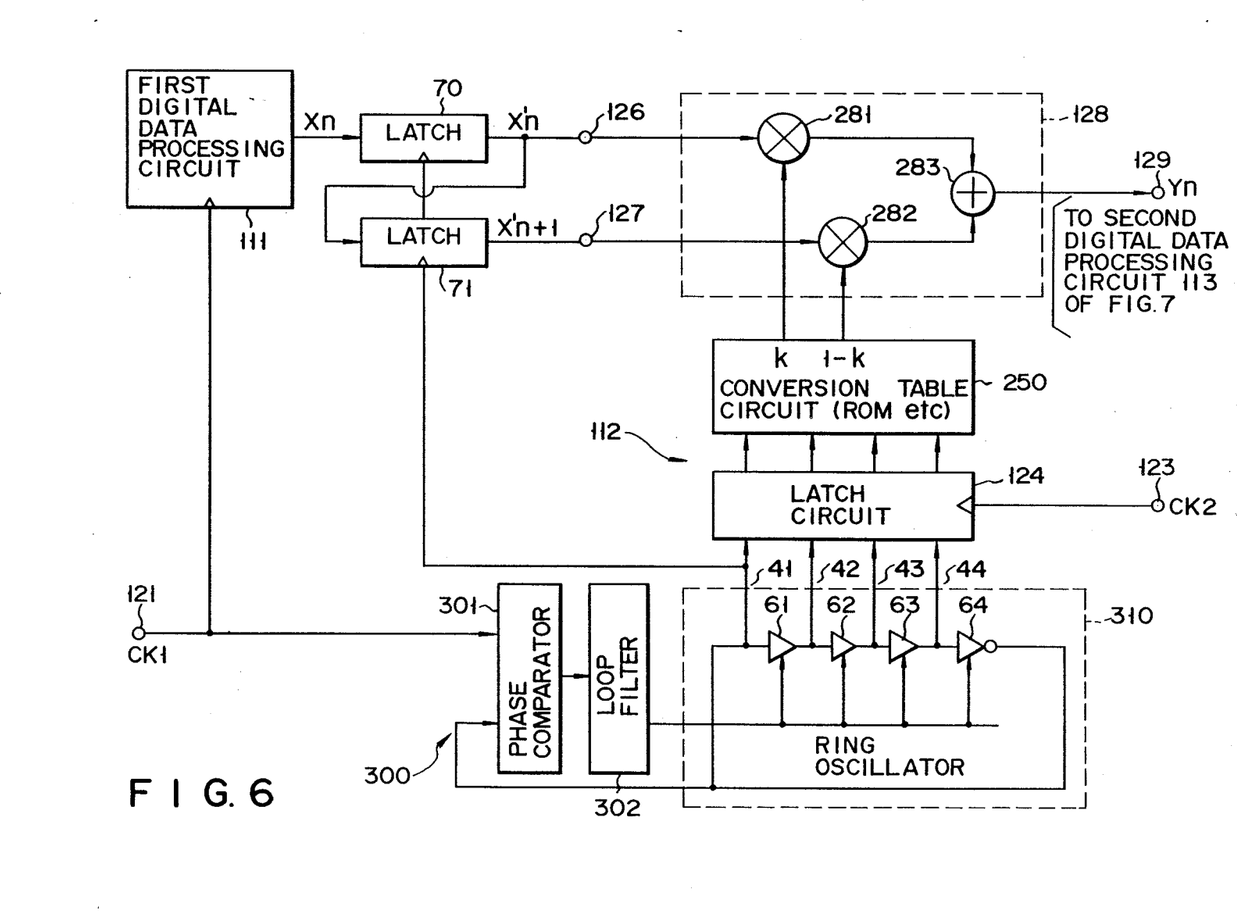
FIG. 6 is a circuit diagram showing still another embodiment of the present invention.

FIGS. 4 and 6 show other embodiments of the present invention in consideration of such an arrangement.

Figure 5:
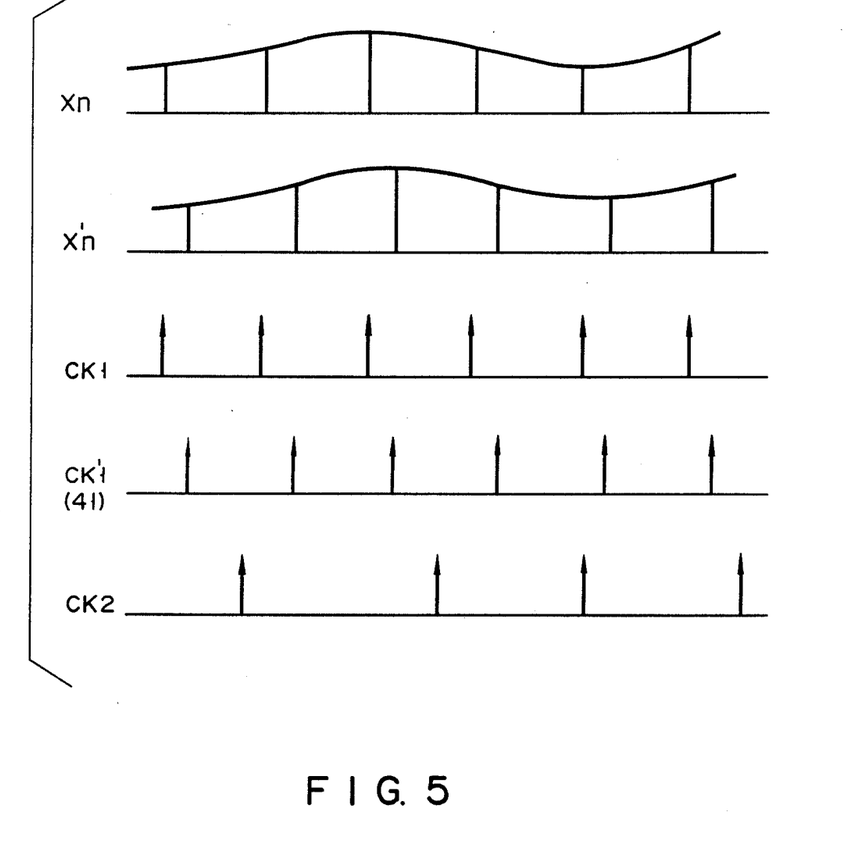
FIG. 5 is a timing chart for explaining an operation of the circuit in FIG. 4.

According to the embodiment in FIG. 4, data $X_n$ and $X_{n+1}$ processed by first digital data processing system 111 by using clock CK1 having first frequency f1 are caused to pass through latches 59 and 60 before they are supplied to variable filter 128 of sample rate conversion circuit 112. In addition, latches 59 and 60 are driven by above-described clock 41. With this arrangement, the data input to variable filter 128 of sample rate conversion circuit 112 are also phase-locked with ring oscillator 310, and hence stable processing can be realized. FIG. 5 shows a relationship between the data and the clocks in the above circuit.

According to the embodiment in FIG. 6, clock 41 of ring oscillator 310 is used even when input data array $X_n$ is processed by latches 70 and 71 and sequentially output as parallel data $X'_n$ and $X'_{n+1}$. In this embodiment, the same effects as in the previous embodiment can be obtained. The sample point of the data itself is phase-locked with ring oscillator 310.

As has been described above, according to the present invention, there is provided an SRC comprising a phase data detector capable of obtaining accurate phase relationship data between clocks having different frequencies by utilizing a simple circuit arrangement without being influenced by a variation in delay element.

What is claimed is:

1. A sample rate conversion circuit for converting first digital data processed by a first clock signal having a first frequency into digital data processed by a second clock signal having a second frequency, comprising:
    ring oscillator means, having a predetermined number of voltage-controlled gate delay elements connected to each other in the form of a loop, for outputting polyphase delay clock signals and a predetermined self-excited oscillation signal;
    phase-locking means for applying a control voltage corresponding to a phase difference between the first clock signal and the self-excited oscillation signal to each of said voltage-controlled gate delay elements so as to phase-lock the first clock signal with the self-excited oscillation signal output from said ring oscillator means;
    latch means for latching the polyphase delay clock signals output from said ring oscillator means in accordance with the second clock signal;
    interpolation coefficient generating means for generating an interpolation coefficient corresponding to phase data between the first and second clock signals in accordance with the polyphase delay clock signals latched by said latch means; and
    interpolating means for interpolating two adjacent data of the first digital data by using the interpolation coefficient generated by said interpolation coefficient generating means and outputting the interpolated data as the second digital data.

2. A circuit according to claim 1, wherein said phase-locking means includes a phase comparator for comparing a phase of the first clock signal with that of the self-excited oscillation signal output from said ring oscillator means, and a loop filter for receiving an output from said phase comparator.

3. A circuit according to claim 1, wherein said interpolation coefficient generating means includes a conversion table circuit for outputting first and second interpolation coefficients k and $(1-k)$ corresponding to the phase data between the first and second clock signals.

4. A circuit according to claim 3, wherein said interpolating means includes a first multiplier for multiplying one of the two adjacent data by the first interpolation coefficient k, a second multiplier for multiplying the other of the two adjacent data by the second interpolation coefficient $(1-k)$, and an adder for adding outputs from said first and second multipliers.

5. A circuit according to claim 1, wherein said interpolation coefficient generating means includes means for providing the phase data by determining a relative phase between the first and second clock signals in accordance with a specific pattern represented by the polyphase delay clock signal latched by said latch means.

6. A circuit according to claim 1, wherein said ring oscillator means outputs the self-excited oscillation signal having frequency $f=\frac{1}{2}n\Delta t$ (where n is the number of the voltage-controlled gate delay elements) when the predetermined number of said voltage-controlled gate delay elements is set to be $\Delta t$, and outputs the polyphase delay clock having a phase relationship obtained by dividing one period of the first clock signal by $2n$.

7. A circuit according to claim 1, further comprising data phase-locking means for lock-phasing the two adjacent data of the first digital data with a specific one of the polyphase clock signals from said ring oscillator means.

8. A circuit according to claim 7, wherein said data phase-locking means includes first and second latches for respectively latching the two adjacent data by using one of the polyphase delay clock signals.

9. A sample rate conversion system comprising:
    a first digital data processing system for sampling input data in accordance with a first clock signal having a first frequency;
    a second digital data processing system for sampling input data in accordance with a second clock signal having a second frequency; and
    sample rate converting means for receiving the data sampled by said first digital data processing system, converting the data into data having a sample rate matched with said second digital data processing system, and outputting the converted data, said sample rate conversion means further comprising:
        phase-locking oscillation means for outputting polyphase delay clock signals phase-locked with the first clock signal,
        interpolation coefficient generating means for obtaining phase data between the first and second clock signals by receiving the polyphase delay clock signals output from said phase-locking oscillation means in response to the second clock signal, and generating an interpolation coefficient corresponding to the phase data, and
        interpolating means for interpolating two adjacent data received from said first digital data processing system in accordance with the interpolation coefficient generated by said interpolation coefficient generating means, and supplying the interpolated data to said second digital data processing system.

10. A circuit according to claim 9, wherein said phase-locking oscillation means includes ring oscillator means, having a predetermined number of voltage-controlled gate delay elements connected to each other in the form of a loop, for outputting the polyphase delay clock signals and a predetermined self-excited oscillation signal.

11. A circuit according to claim 10, wherein said phase-locking means includes a phase comparator for comparing a phase of the first clock signal with that of the self-excited oscillation signal output from said ring oscillator means, and a loop filter for receiving an output from said phase comparator.

12. A circuit according to claim 10, wherein said ring oscillator means outputs the self-excited oscillation signal having frequency $f = \frac{1}{2}n\Delta t$ (where n is the number of the voltage-controlled gate delay elements) when the predetermined number of said voltage-controlled gate delay elements is set to be $\Delta t$, and outputs the polyphase delay clock having a phase relationship obtained by dividing one period of the first clock signal by $2n$.

13. A circuit according to claim 10, further comprising data phase-locking means for lock-phasing the two adjacent data of the first digital data with a specific one of the polyphase clock signals from said ring oscillator means.

14. A circuit according to claim 13, wherein said data phase-locking means includes first and second latches for respectively latching the two adjacent data by using one of the polyphase delay clock signals.

15. A circuit according to claim 9, wherein said interpolation coefficient generating means includes a conversion table circuit for outputting first and second interpolation coefficients k and $(1-k)$ corresponding to the phase data between the first and second clock signals.

16. A circuit according to claim 15, wherein said interpolating means includes a first multiplier for multiplying one of the two adjacent data by the first interpolation coefficient k, a second multiplier for multiplying the other of the two adjacent data by the second interpolation coefficient $(1-k)$, and an adder for adding outputs from said first and second multipliers.

17. A circuit according to claim 9, wherein said interpolation coefficient generating means includes means for providing the phase data by determining a relative phase between the first and second clock signals in accordance with a specific pattern represented by the polyphase delay clock signal latched by said latch means.

* * * * *